(12) United States Patent
Wang

(10) Patent No.: US 10,421,660 B2
(45) Date of Patent: Sep. 24, 2019

(54) MICRO-NUCLEAR BATTERY AND ENERGY CONVERSION METHOD THEREOF

(71) Applicant: BOE TECHNOLOGY GROUP CO., LTD., Beijing (CN)

(72) Inventor: Xin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 151 days.

(21) Appl. No.: 15/523,352

(22) PCT Filed: May 23, 2016

(86) PCT No.: PCT/CN2016/082984
§ 371 (c)(1),
(2) Date: Apr. 28, 2017

(87) PCT Pub. No.: WO2017/148019
PCT Pub. Date: Sep. 8, 2017

(65) Prior Publication Data
US 2018/0118559 A1    May 3, 2018

(30) Foreign Application Priority Data
Mar. 2, 2016    (CN) .......................... 2016 1 0119087

(51) Int. Cl.
*B81B 3/00*    (2006.01)
*G21H 1/06*    (2006.01)
(Continued)

(52) U.S. Cl.
CPC .............. *B81B 3/0032* (2013.01); *G21H 1/02* (2013.01); *G21H 1/06* (2013.01); *G21H 3/00* (2013.01); *B81B 2203/0118* (2013.01)

(58) Field of Classification Search
CPC .. G21G 1/02; G21G 1/06; G21G 1/00; G21G 3/00; B81B 2203/0118; B81B 3/0032
See application file for complete search history.

(56) References Cited

U.S. PATENT DOCUMENTS 4,676,104 A * 6/1987 Cullen ................ G01P 15/0975
310/313 R
6,479,920 B1 * 11/2002 Lal .......................... G21H 1/00
310/309
(Continued)

FOREIGN PATENT DOCUMENTS

CN      101246756 A      8/2008
CN      102185520 A      9/2011
(Continued)

OTHER PUBLICATIONS

Chen, Xueqiang, "Design and Simulation of MEMS Piezoelectric Isotope Battery", University of North China, dated Jul. 31, 2017, 60 pages.
(Continued)

Primary Examiner — Imran Akram
(74) Attorney, Agent, or Firm — Kinney & Lange, P.A.

(57) ABSTRACT

The present disclosure discloses a micro-nuclear battery. The micro-nuclear battery comprises a base frame comprising a bottom, a top and a side wall; a cantilever structure having a free end hung in the air and a fixed end fixed to the side wall of the base frame and provided with a piezoelectric component thereon; and a radiation unit comprising an upper radioactive source and a lower radioactive source configured to emit electrons to the free end and respectively arranged at positions in inner surfaces on the top and the bottom of the base frame corresponding to the free end of the cantilever structure, wherein a width of the free end is greater than a width of the fixed end.

12 Claims, 5 Drawing Sheets

(51) Int. Cl.
*G21H 1/02* (2006.01)
*G21H 3/00* (2006.01)

(56) References Cited

U.S. PATENT DOCUMENTS

| | | | | |
|---|---|---|---|---|
| 7,245,062 | B2* | 7/2007 | Schmidt | H01L 41/1136 290/1 R |
| 7,301,254 | B1* | 11/2007 | Lal | G21H 1/02 310/309 |
| 2002/0175597 | A1* | 11/2002 | Raman | F04D 33/00 310/328 |
| 2004/0163942 | A1 | 8/2004 | Yoshida et al. | |
| 2008/0042518 | A1* | 2/2008 | Liu | H01H 59/0009 310/319 |
| 2011/0241839 | A1* | 10/2011 | Lal | G21H 1/02 340/10.1 |
| 2017/0283249 | A1* | 10/2017 | Dogiamis | B81C 1/0015 |

FOREIGN PATENT DOCUMENTS

| | | |
|---|---|---|
| CN | 102273059 A | 12/2011 |
| CN | 103872946 A | 6/2014 |
| CN | 104300833 A | 1/2015 |

OTHER PUBLICATIONS

First Chinese Office Action, for Chinese Patent Application No. 201610119087.3, dated Mar. 13, 2017, 2 pages.
International Search Report and Written Opinion (including English translation of Box V) for PCT Patent Application PCT/CN2016/082984, dated Oct. 19, 2016, 14 pages.

* cited by examiner

MICRO-NUCLEAR BATTERY AND ENERGY CONVERSION METHOD THEREOF

CROSS-REFERENCE TO RELATED APPLICATION(S)

The present application is a U.S. National Phase Application of International Application No. PCT/CN2016/082984, filed on May 23, 2016, entitled "MICRO-NUCLEAR BATTERY AND ENERGY CONVERSION METHOD THEREOF," which claims priorities to Chinese Patent Application No. 201610119087.3, filed on Mar. 2, 2016, both of which are incorporated herein by reference in their entireties.

TECHNICAL FIELD

The present disclosure relates to the field of nuclear batteries, and more particularly, to a micro-nuclear battery for a micro-electro-mechanical system and an energy conversion method thereof.

BACKGROUND

With the development of science and technology, sizes of various devices are getting smaller and smaller, and Micro-Electro-Mechanical Systems (MEMSs) have become more and more widely used in many fields. However, the development of the MEMSs has been limited by two factors, one of which is that the MEMS devices are lack of sufficient power to operate remotely, and the other of which is that power sources with a high power density and a long life are required for realization of the MEMSs. In order to solve these problems, many types of power sources such as fossil fuel batteries, solar batteries etc are tried to supply power to the MEMSs. But these types of power sources need to be charged or supplemented with fuels, which is difficult for the MEMS devices to achieve. Further, there are other defects in these power sources, for example, fossil fuels have a negative impact on the environment. Nuclear batteries can overcome the above two restrictions, have a small size, a light weight, a long life and strong anti-interference, and thus become candidate power sources for the MEMS devices. Micro-nuclear batteries can be divided into indirect type micro-nuclear batteries and direct type micro-nuclear batteries in accordance with the principle of energy conversion, and cantilever type nuclear batteries of the micro-nuclear batteries are indirect type nuclear batteries for energy conversion.

However, the existing cantilever type nuclear batteries can only convert limited power, and there is a need for nuclear batteries which can efficiently convert nuclear energy into electric energy and output the electric energy.

SUMMARY

In view of the above, the present disclosure provides a micro-nuclear battery for an MEMS and an energy conversion method thereof, which solve the problem of conversion of insufficient energy for conventional cantilever type nuclear batteries.

According to an aspect of the present disclosure, there is proposed a micro-nuclear battery, comprising:
a base frame comprising a bottom, a top and a side wall;
a cantilever structure having a free end hung in the air and a fixed end fixed to the side wall of the base frame and provided with a piezoelectric component thereon; and
a radiation unit comprising an upper radioactive source and a lower radioactive source configured to emit electrons to the free end and respectively arranged at positions in inner surfaces on the top and the bottom of the base frame corresponding to the free end,
wherein a width of the free end is greater than a width of the fixed end.

In an embodiment, a ratio of the width of the free end to the width of the fixed end is between 2.5 and 6.

In an embodiment, the micro-nuclear battery further comprises: a radiation source control module electrically connected to the radiation unit and configured to control the radiation unit to emit electrons periodically.

In an embodiment, the radiation source control module controls the upper radiation source and the lower radiation source to emit electrons alternately.

In an embodiment, a distance between the cantilever structure and one of the upper radiation source and the lower radiation source is smaller than a distance between the cantilever structure and the other of the upper radiation source and the lower radiation source.

In an embodiment, the piezoelectric component is formed of a piezoelectric material and is configured to generate a current pulse based on mechanical oscillation of the cantilever structure.

In an embodiment, the micro-nuclear battery further comprises:
a direct current conversion module electrically connected to the piezoelectric component of the cantilever structure and configured to convert a current pulse generated by the piezoelectric component into a direct current.

In an embodiment, the direct current conversion module further comprises a functional module configured to implement at least one of the following functions: transformation, rectification, filtering, and voltage regulation.

In an embodiment, the radiation unit comprises a β radiation source.

In an embodiment, the free end and the fixed end are connected via a connection portion therebetween.

In an embodiment, the cantilever structure is formed of an elastic material.

According to another aspect of the present disclosure, there is proposed an energy conversion method for the micro-nuclear battery described above, comprising:
controlling, by the radiation source control module, the radiation unit to periodically emit electrons to the free end of the cantilever structure;
generating, by the piezoelectric component, a current pulse based on mechanical oscillation of the cantilever structure; and
converting, by the direct current conversion module, the current pulse generated by the piezoelectric component into a direct current.

In an embodiment, controlling the radiation unit to periodically emit electrons to the free end of the cantilever structure comprises: controlling the upper radiation source and the lower radiation source to emit electrons alternately.

BRIEF DESCRIPTION OF THE DRAWINGS

The above and other aspects, features and advantages of the various embodiments of the present disclosure will become more apparent from the following detailed description taken in conjunction with the accompanying drawings, in which.

DETAILED DESCRIPTION

The present disclosure will be described in detail below with reference to the accompanying drawings.

Figure 1A:
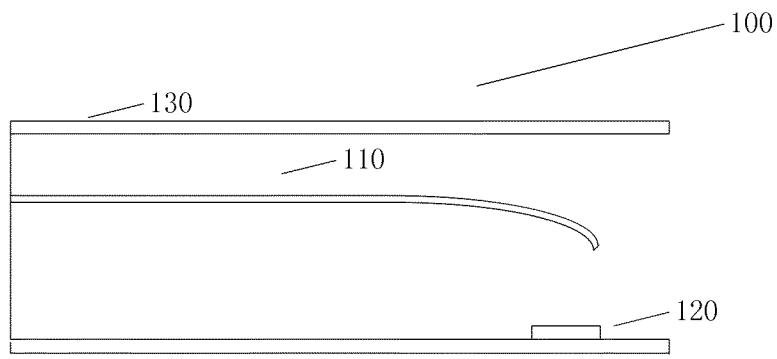
FIG. 1A illustrates a side view of a structure of a cantilever type nuclear battery in the prior art.
Figure 1B:
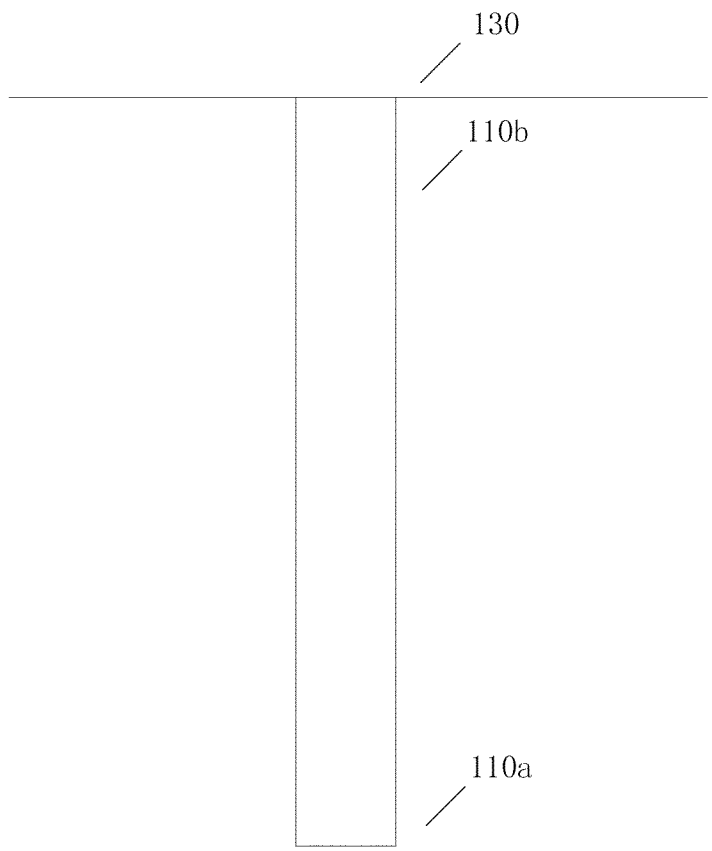
FIG. 1B illustrates a top view of a cantilever structure of the nuclear battery in FIG. 1A in the prior art.

FIG. 1A illustrates a side view of a main body of a conventional cantilever type nuclear battery, and FIG. 1B illustrates a top view (in a direction from top to bottom in FIG. 1A) of a cantilever structure of the nuclear battery. In FIG. 1A, the main body 100 of the conventional cantilever type nuclear battery comprises a base frame 130, a cantilever structure 110 and a radiation unit 120. As shown in FIG. 1B, the cantilever structure 110 is a flat rectangular strip comprising a free end 110a and a fixed end 110b. The free end 110a of the cantilever structure 110 is hung in the air and the fixed end 110b of the cantilever structure 110 is fixed to a side wall of the base frame 130. The radiation unit 120 with a radiation material is located at a position on the bottom of the base frame 130 corresponding to the free end 110a of the cantilever structure 110 and configured to emit electrons to the free end 110a of the cantilever structure 110.

Figure 4:
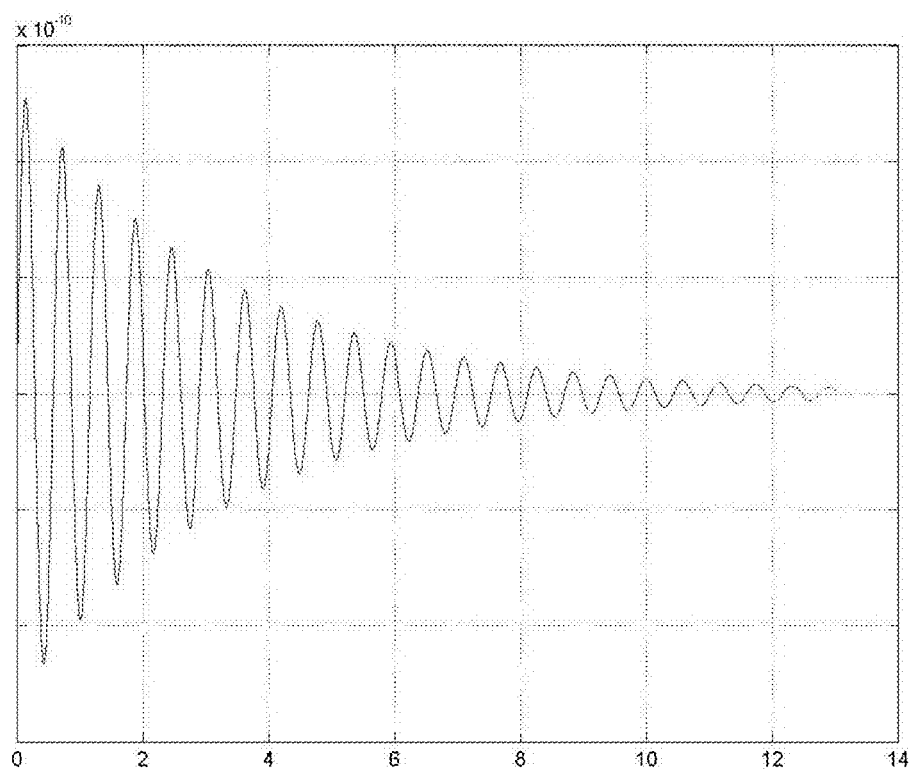
FIG. 4 illustrates an example waveform diagram of a pulse current generated by a micro-nuclear battery according to an embodiment of the present disclosure.

The radiation unit 120 emits electrons to the cantilever structure 110, so that the free end 110a of the cantilever structure 110 collects charged particles from the radiation unit 120 and is positively charged, and negative charges remain in the radiation unit 120. Thereby, an electrostatic field is formed between the radiation unit 120 and the free end 110a of the cantilever structure 110. The cantilever structure 110 is bent toward the radiation unit 120 by the attraction of an electrostatic force. When the free end of the cantilever structure 110 contacts the radiation unit 120, positive and negative charges are neutralized, the electrostatic force disappears, and the cantilever bounces upward and begins to oscillate. Subsequently, the oscillation gradually slows down and eventually stops. Thereafter, the radiation unit 120 may re-emit electrons to start a new oscillation period. During each oscillation period, the oscillation of the cantilever structure 110 is used to convert mechanical energy into a current pulse through a piezoelectric material of the fixed end thereof (as shown in FIG. 4). In this way, with the above operating principle, the cantilever type nuclear battery converts the nuclear energy of the radiation material into mechanical energy, and further converts the mechanical energy into electric energy, thus realizing the nuclear battery.

Figure 2:
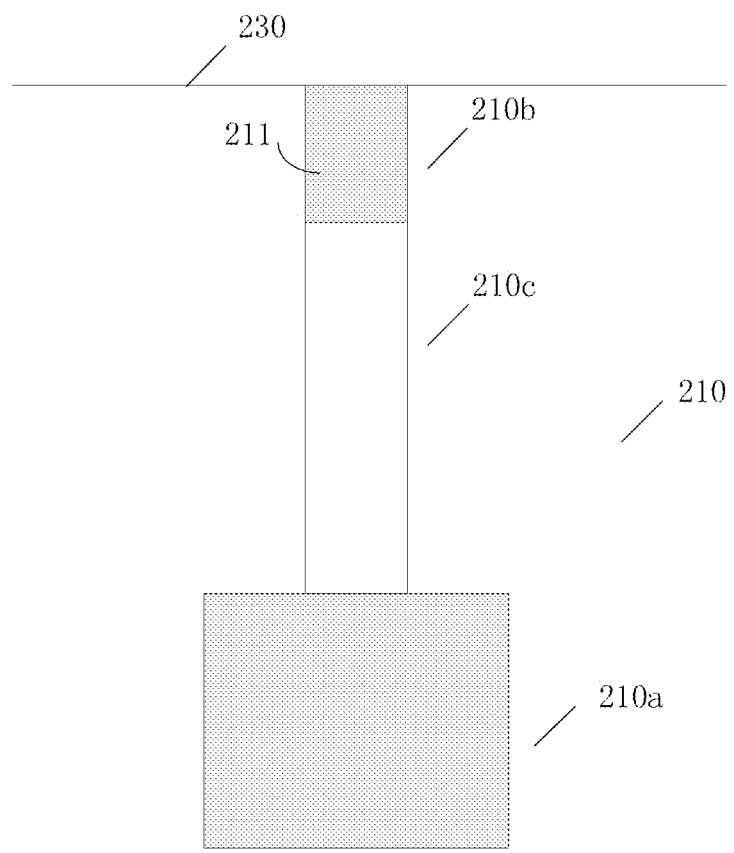
FIG. 2 illustrates a top view of a cantilever structure in a micro-nuclear battery according to an embodiment of the present disclosure.

FIG. 2 illustrates a top view of a cantilever structure 210 in a micro-nuclear battery according to an embodiment of the present disclosure. Other portions of the micro-nuclear battery according to the present embodiment can be seen in the structure shown in FIG. 1.

Specifically, the micro-nuclear battery according to the present embodiment comprises a base frame 230 (only a side wall of the base frame is illustrated), a cantilever structure 210 and a radiation unit. The cantilever structure 210 has a free end 210a hung in the air and a fixed end 210b fixed to the side wall of the base frame 230. A piezoelectric component 211 is provided on the fixed end 210b of the cantilever structure 210.

As can be seen in FIG. 2, a width of the free end 210a is greater than a width of the fixed end 210b. In this way, as an area of the free end 210a increases, the converted current also increases, thereby increasing the efficiency of conversion of nuclear energy into electric energy. However, when a width ratio is too large, the cantilever structure is easily broken, and therefore a suitable performance can be achieved by selecting the ratio of the width of the free end 210a to the width of the fixed end 210b. In an embodiment, the ratio of the widths is between 2.5 and 6.

The free end 210a and the fixed end 210b are connected via a connection portion 210c therebetween and together constitute the cantilever structure 210. As shown in FIG. 2, there are illustrated a free end 210a, a fixed end 210b and a connection portion 210c each having a specific length. However, it is to be understood that the lengths of the free end 210a, the fixed end 210b and the connection portion 210c are not limited thereto. For example, in a specific embodiment, the fixed end 210b and the free end 210a may be connected directly without the connection portion 210c therebetween.

In addition, as shown in FIG. 2, the cantilever structure 210 is in a T shape, and the fixed end 210b has the same width as that of the connection portion 210c (both smaller than the width of the free end 210a). However, it is to be understood that the widths of the free end 210a, the fixed end 210b and the connection portion 210c are not limited thereto. In a specific embodiment, the fixed end 210b may have a different width from that of the connection portion 210c.

Furthermore, as shown in FIG. 2, the free end 210a, the fixed end 210b and the connection portion 210c are rectangular. However, it is to be understood that the shapes of the free end 210a, the fixed end 210b and the connection portion 210c are not limited thereto. For example, in a specific embodiment, at least one of the free end 210a, the fixed end 210b and the connection portion 210c may be tapered, circular or trapezoidal etc. In this case, a width of any portion of the cantilever structure 210 is a maximum width of the portion in a direction perpendicular to a longitudinal direction of the cantilever structure.

In addition, in a embodiment, the cantilever structure 210 is formed of an elastomeric material (for example, copper), so that the radiation unit emits electrons to the cantilever structure 210. In this way, when an electrostatic field is formed between the radiation unit and the free end 210a of the cantilever structure 210, the cantilever structure 210 can be bent to the radiation unit by the attraction of an electrostatic force to contact the radiation unit, and positive and negative charges are neutralized, thereby the electrostatic force disappears, and the cantilever structure bounces upward and begins to oscillate.

Figure 3:
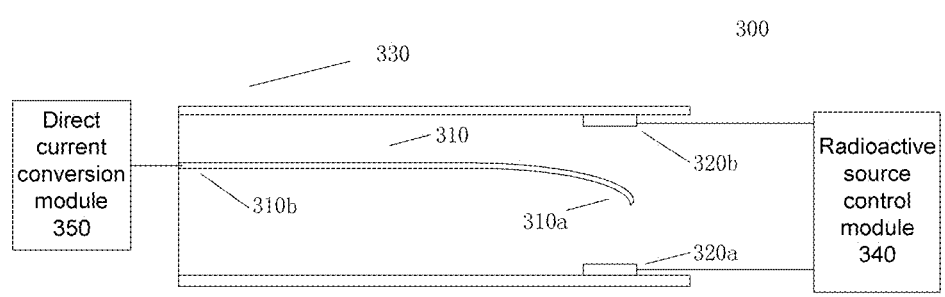
FIG. 3 illustrates a block diagram of a structure of a micro-nuclear battery according to an embodiment of the present disclosure.

Next, as shown in FIG. 3, there is illustrated a block diagram of a structure of a micro-nuclear battery 300 according to an embodiment of the present disclosure. As can be seen from FIG. 3, the radiation unit 320 of the micro-nuclear battery 300 comprises an upper radiation source 320b and a lower radiation source 320a. The upper radiation source 320b and the lower radiation source 320a are arranged above and below the free end 310a of the cantilever structure 310, respectively. The radiation sources included in the radiation unit 320 may be β radiation sources. The radiation sources may have a material of P35.

In FIG. 3, the upper radiation source 320b and the lower radiation source 320a are arranged to protrude from inner surfaces on the top and the bottom of the base frame 330 of the nuclear battery 300. However, it is to be understood that the arrangement of the upper radiation source 320b and the lower radiation source 320a is not limited thereto. For example, in a specific embodiment, the upper radiation source 320b and the lower radiation source 320a may be specific blocks embedded in the inner surfaces. In another specific embodiment, the upper radiation source 320b and the lower radiation source 320a are formed as radiation coatings in the upper inner surface and the lower inner surface of the base frame 330 corresponding to the free end 310a.

According to any of the embodiments of the present disclosure, the micro-nuclear battery 300 further comprises a radiation source control module 340. The radiation source control module 340 is configured to control a radiation unit (for example, the upper radiation source 320b and the lower radiation source 320a in FIG. 3) to emit electrons. Specifically, the radiation unit emits electrons to the cantilever structure 310, so that the free end 310a of the cantilever structure 310 collects charged particles from the radiation unit and is then positively charged, and negative charges remain in the radiation unit. In this way, an electrostatic field is formed between the radiation unit and the free end 310a of the cantilever structure 310. The cantilever structure 310 is bent toward the radiation unit by the attraction of an electrostatic force. When the free end 310a of the cantilever structure 310 contacts the radiation unit, positive and negative charges are neutralized, the electrostatic force disappears, and the cantilever structure 310 bounces upward and begins to oscillate. Subsequently, the oscillation gradually slows down and eventually stops. Thereafter, the radiation unit may re-emit electrons to start a new oscillation period. Therefore, in an embodiment, the radiation source control module 340 may control the radiation unit to emit electrons periodically. During each oscillation period, the oscillation of the cantilever structure 310 is used convert mechanical energy into a current pulse through the piezoelectric material of the fixed end thereof (as shown in FIG. 4).

In the embodiment according to FIG. 3, the radiation source control module 340 may control the upper radiation source 320b and the lower radiation source 320a to emit electrons alternately. In an embodiment, an electron emission mode of the lower radiation source 320a is the same as that in the nuclear battery shown in FIG. 1, and the upper radiation source 320b starts to emit electrons when the cantilever structure 310 bounces from the bottom to the highest point. The time to emit electrons may be estimated according to a vibration period of a vibrator determined by physical parameters of the cantilever structure 310. However, the present disclosure is not limited thereto, and in practice, any suitable time interval may also be used to cause the upper radiation source 320b and the lower radiation source 320a to emit electrons alternately. In this way, the electrons are emitted alternately by the upper radiation source 320b and the lower radiation source 320a, so that the cantilever can efficiently convert the nuclear energy of the radiation material into mechanical energy, thereby more efficiently providing electric energy.

As can be seen from FIG. 3, a distance between the cantilever structure 310 and the upper radiation source 320b is smaller than a distance between the cantilever structure 310 and the lower radiation source 320a, so that a case of failure in oscillation of the cantilever can be avoided. However, it is to be understood that the distance relationship is not limited thereto. In other embodiments, the distance between the cantilever structure 310 and the upper radiation source 320b may be greater than the distance between the cantilever structure 310 and the lower radiation source 320a.

According to any of the embodiments of the present disclosure, the micro-nuclear battery 300 further comprises a direct current conversion module 350. The direct current conversion module 350 is electrically connected to a piezoelectric component on the fixed end 310b of the cantilever structure 310, to convert a current pulse generated by the oscillation of the cantilever structure into a direct current.

Figure 5:
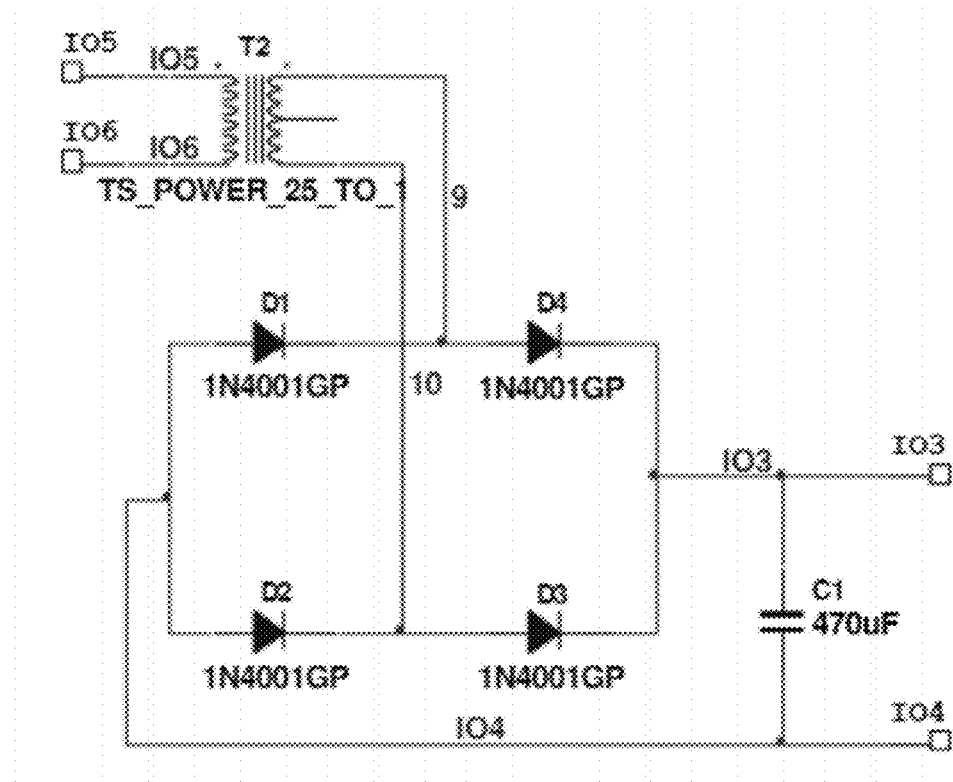
FIG. 5 illustrates an example circuit diagram of a transformation module and a rectification module of a micro-nuclear battery according to an embodiment of the present disclosure.
Figure 6:
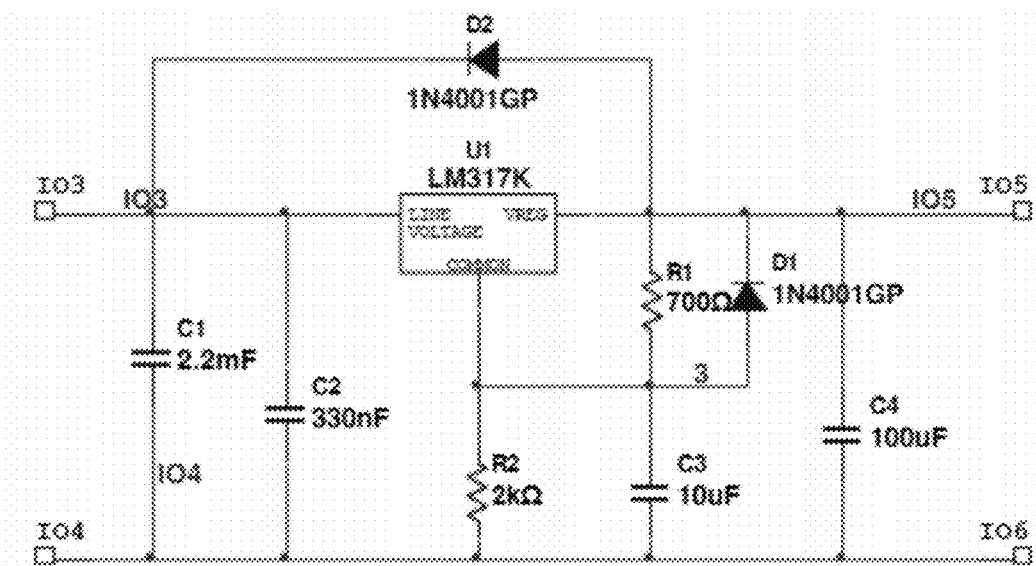
FIG. 6 illustrates an example circuit diagram of a filtering module and a voltage regulation module of a micro-nuclear battery according to an embodiment of the present disclosure.

In an embodiment, the direct current conversion module 350 further comprises a functional module for implementing at least one of the following functions: transformation, rectification, filtering, and voltage regulation. Specifically, an example circuit diagram of a transformation module and a rectification module according to an exemplary embodiment is shown in FIG. 5, and an example circuit diagram of a filtering module and a voltage regulation module according to an exemplary embodiment is shown in FIG. 6.

According to any of the embodiments of the present disclosure, the piezoelectric component is formed of a piezoelectric material such as a PIZ material.

Figure 7:
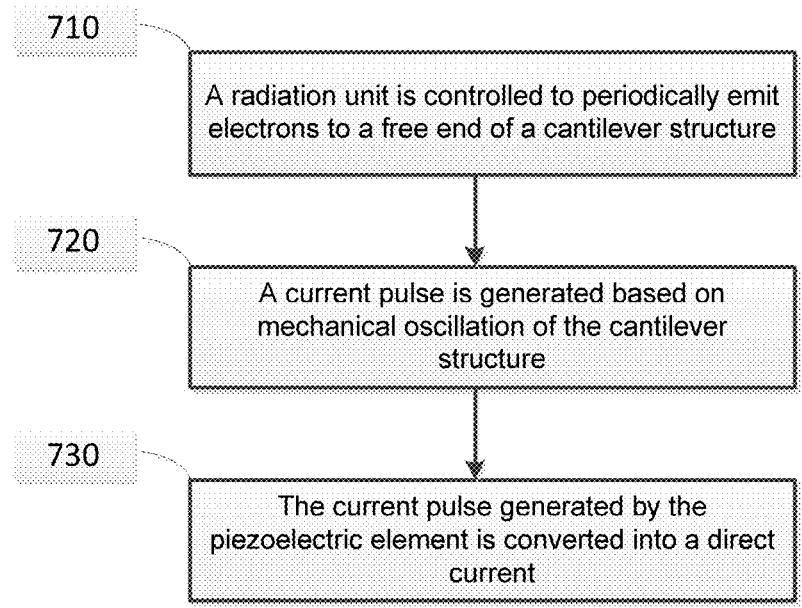
FIG. 7 illustrates a flowchart of an energy conversion method for a micro-nuclear battery according to an embodiment.

FIG. 7 illustrates a flowchart of an energy conversion method for a micro-nuclear battery according to an embodiment of the present disclosure. The method comprises the following steps.

In step 710, a radiation unit is controlled by a radiation source control module to periodically emit electrons to a free end of a cantilever structure.

In step 720, a current pulse is generated by a piezoelectric component based on mechanical oscillation of the cantilever structure.

In step 730, the current pulse generated by the piezoelectric component is converted by a direct current conversion module into a direct current.

In an embodiment, step 710 further comprises: controlling an upper radiation source and a lower radiation source to emit electrons alternately.

The present disclosure provides a micro-nuclear battery and an energy conversion method thereof, which can more efficiently convert nuclear energy into electric energy by setting two radiation sources on the top and the bottom of a base frame respectively and controlling the two radiation sources to emit electrons alternately to a free end of a cantilever structure, so as to meet the requirements for the power supply of the micro-electro-mechanical system device.

It should be noted that the scope of the subject content to be protected by the present disclosure is not limited to the specific embodiments described herein. For example, some embodiments may be in a form of hardware, so that the present disclosure is implemented on for example a device or a combination of devices, while other embodiments may be in a form of software and/or firmware. Similarly, although the scope of the subject content to be protected is not limited in this aspect, some embodiments may comprise one or more materials, for example, a storage medium or storage media.

The storage medium may be for example a CD-ROM, a computer disc, a flash memory or the like, which may have instructions stored thereon. The instructions when executed by a system such as a computer system, a computing platform, another system or the like, may enable a processor to implement one of the embodiments described above according to the subject content to be protected. In a possible implementation, the computing platform may comprise one or more processing units or processors, one or more input/output devices (for example, a display, a keyboard and/or a mouse), and one or more memories (for example, a static random access memory, a dynamic random access memory, a flash memory, and/or a hardware driver).

Further, it should also be noted that the technical solutions of the present disclosure are merely described by way of example in the above description, and it does not mean that the present disclosure is limited to the above steps and structures. The steps and structures may be adjusted and selected as needed if possible. Therefore, some steps and units are not elements necessary for implementing the general inventive idea of the present disclosure. Consequently, the technical features necessary for the present disclosure are merely limited by the minimum requirements for implementing the general inventive idea of the present disclosure instead of the above specific examples.

While the present disclosure has been shown in connection with the preferred embodiments of the present disclosure, it will be understood by those skilled in the art that various modifications, substitutions, and alterations may be made therein without departing from the spirit and scope of the present disclosure. Accordingly, the present disclosure should not be limited by the above-described embodiments, and instead should be defined by the appended claims and their equivalents.

I claim:

1. A micro-nuclear battery, comprising:
    a base frame comprising a bottom, a top and a side wall;
    a cantilever structure having a free end and a fixed end fixed to the side wall of the base frame and provided with a piezoelectric component thereon; and
    a radiation unit comprising an upper radioactive source and a lower radioactive source configured to emit electrons to the free end and respectively arranged at positions in inner surfaces on the top and bottom of the base frame corresponding to that are over opposite sides of the free end of the cantilever structure,
    wherein a width of the free end is greater than a width of the fixed end;
    wherein a distance between the cantilever structure and one of the upper radiation source and the lower radiation source is smaller than a distance between the cantilever structure and the other of the upper radiation source and the lower radiation source.

2. The micro-nuclear battery according to claim 1, wherein a ratio of the width of the free end to the width of the fixed end is between 2.5 and 6.

3. The micro-nuclear battery according to claim 1, further comprising: a radiation source control module electrically connected to the radiation unit and configured to control the radiation unit to emit electrons periodically.

4. The micro-nuclear battery according to claim 3, wherein the radiation source control module controls the upper radiation source and the lower radiation source to emit electrons alternately.

5. The micro-nuclear battery according to claim 1, wherein the piezoelectric component is formed of a piezoelectric material and is configured to generate a current pulse based on mechanical oscillation of the cantilever structure.

6. The micro-nuclear battery according to claim 1, further comprising:
    a direct current conversion module electrically connected to the piezoelectric component of the cantilever structure and configured to convert a current pulse generated by the piezoelectric component into a direct current.

7. The micro-nuclear battery according to claim 6, wherein the direct current conversion module further comprises a functional module configured to implement at least one of the following functions: transformation, rectification, filtering, and voltage regulation.

8. The micro-nuclear battery according to claim 1, wherein the radiation unit comprises a $\beta$ radiation source.

9. The micro-nuclear battery according to claim 1, wherein the free end and the fixed end are connected via a connection portion therebetween.

10. The micro-nuclear battery according to claim 1, wherein the cantilever structure is formed of an elastic material.

11. An energy conversion method using the micro-nuclear battery according to claim 1, comprising:
    controlling, by the radiation source control module, the radiation unit to periodically emit electrons to the free end of the cantilever structure;
    generating, by the piezoelectric component, a current pulse based on mechanical oscillation of the cantilever structure; and
    converting, by the direct current conversion module, the current pulse generated by the piezoelectric component into a direct current.

12. The energy conversion method of claim 11, wherein controlling the radiation unit to periodically emit electrons to the free end of the cantilever structure comprises: controlling the upper radiation source and the lower radiation source to emit electrons alternately.

* * * * *

UNITED STATES PATENT AND TRADEMARK OFFICE
CERTIFICATE OF CORRECTION

PATENT NO.        : 10,421,660 B2
APPLICATION NO.   : 15/523352
DATED             : September 24, 2019
INVENTOR(S)       : Xin Wang Page 1 of 1

It is certified that error appears in the above-identified patent and that said Letters Patent is hereby corrected as shown below:

Column 7, Line 45 Claim 1:
Delete "corresponding to"

Signed and Sealed this
Fifth Day of May, 2020

Andrei Iancu
*Director of the United States Patent and Trademark Office*